United States Patent
Patel et al.

(10) Patent No.: US 11,001,919 B2
(45) Date of Patent: May 11, 2021

(54) MONOLAYER-BY-MONOLAYER GROWTH OF MGO LAYERS USING MG SUBLIMATION AND OXIDATION

(71) Applicant: Taiwan Semiconductor Manufacturing Company, Ltd., Hsin-Chu (TW)

(72) Inventors: Sahil Patel, Fremont, CA (US); Guenole Jan, San Jose, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/872,074

(22) Filed: May 11, 2020

(65) Prior Publication Data

US 2020/0270737 A1   Aug. 27, 2020

Related U.S. Application Data

(63) Continuation of application No. 16/161,161, filed on Oct. 16, 2018, now Pat. No. 10,648,069.

(51) Int. Cl.
*H01L 43/12* (2006.01)
*C23C 14/00* (2006.01)
(Continued)

(52) U.S. Cl.
CPC ........ *C23C 14/0042* (2013.01); *C23C 14/081* (2013.01); *H01L 43/08* (2013.01);
(Continued)

(58) Field of Classification Search
CPC ....... H01L 2924/00; H01L 2924/00011; H01L 21/0228; H01L 21/3141; H01L 21/32051
See application file for complete search history.

(56) References Cited

U.S. PATENT DOCUMENTS 6,402,579 B1 * 6/2002 Pichler ............... H01L 51/5203
445/24
6,544,357 B1 * 4/2003 Hehmann ............... C23C 14/14
148/420
(Continued)

FOREIGN PATENT DOCUMENTS

| JP | 2003289163 | 10/2003 |
|---|---|---|
| WO | WO 0004591 | 1/2000 |
| WO | WO 2010044134 | 4/2010 |

OTHER PUBLICATIONS

PCT Search Report, Application No. PCT/US2015/013436, Applicant: Headway Technologies, Inc., dated Aug. 3, 2015, 21 pages.
(Continued)

*Primary Examiner* — Jaehwan Oh
(74) *Attorney, Agent, or Firm* — Haynes and Boone, LLP

(57) ABSTRACT

A MgO layer is formed using a process flow wherein a Mg layer is deposited at a temperature <200° C. on a substrate, and then an anneal between 200° C. and 900° C., and preferably from 200° C. and 400° C., is performed so that a Mg vapor pressure >$10^{-6}$ Torr is reached and a substantial portion of the Mg layer sublimes and leaves a Mg monolayer. After an oxidation between −223° C. and 900° C., a MgO monolayer is produced where the Mg:O ratio is exactly 1:1 thereby avoiding underoxidized or overoxidized states associated with film defects. The process flow may be repeated one or more times to yield a desired thickness and resistance x area value when the MgO is a tunnel barrier or Hk enhancing layer. Moreover, a doping element (M) may be added during Mg deposition to modify the conductivity and band structure in the resulting MgMO layer.

20 Claims, 8 Drawing Sheets

(51) Int. Cl.
*C23C 14/08* (2006.01)
*H01L 43/08* (2006.01)
*H01L 43/10* (2006.01)
*C01F 5/04* (2006.01)

(52) U.S. Cl.
CPC .............. *H01L 43/10* (2013.01); *H01L 43/12* (2013.01); *C01F 5/04* (2013.01)

(56) References Cited

U.S. PATENT DOCUMENTS

| | | |
|---|---|---|
| 7,978,505 B2 | 7/2011 | Zhou |
| 8,203,389 B1 | 6/2012 | Zhou et al. |
| 8,324,697 B2 | 12/2012 | Worledge |
| 8,508,006 B2 | 8/2013 | Jan et al. |
| 8,557,407 B2 | 10/2013 | Zhao et al. |
| 8,592,927 B2 | 11/2013 | Jan et al. |
| 8,609,262 B2 | 12/2013 | Horng et al. |
| 9,761,795 B2 | 9/2017 | Park et al. |
| 9,865,805 B2 | 1/2018 | Seino et al. |
| 2006/0227466 A1 | 10/2006 | Yagami |
| 2011/0014500 A1 | 1/2011 | Horng et al. |
| 2011/0086439 A1 | 4/2011 | Choi |
| 2012/0075752 A1 | 3/2012 | Sato et al. |
| 2012/0139649 A1 | 6/2012 | Zhou et al. |
| 2012/0199470 A1 | 8/2012 | Mori et al. |
| 2012/0205758 A1 | 8/2012 | Jan et al. |
| 2013/0175644 A1 | 7/2013 | Horng et al. |
| 2013/0333254 A1 | 12/2013 | Wallis et al. |
| 2014/0056061 A1 | 2/2014 | Khvalkovskiy et al. |
| 2015/0333254 A1 | 11/2015 | Liu et al. |
| 2016/0005958 A1* | 1/2016 | Seino ..................... H01L 43/12 438/3 |
| 2020/0115788 A1 | 4/2020 | Patel et al. |

OTHER PUBLICATIONS

PCT Written Opinion, Application No. PCT/US2015/013436, Applicant: Headway Technologies, Inc., dated Aug. 3, 2015, 17 pages.
PCT Search Report, Application No. PCT/US2015/013436, Applicant: Headway Technologies, Inc., dated May 11, 2015, 21 pages.
Chinese Office Action, File No. 201580032651.1, Applicant: Headway Technologies, Inc., dated Sep. 5, 2018, 13 pages, and English language translation, 13 pages.
Luo, Yu-Ran, "Bond Dissociation Energies", Journal of Chemical Theory and Computation, Feb. 23, 2010, pp. 9-65 to 9-98, XP055336421, Chapter 1, Retrieved from the Internet. URL: http://staff.ustc.edu.on/luo971/2010-91-CRC-BDEs-Tables.pdf.
Slonczewski, J.C., "Current-driven excitation of magnetic multilayers", Journal of Magnetism and Magnetic Materials, 159, L1-L7, Jun. 1996, Elsevier.
Butler, W.H., et al., "Spin-dependent tunneling conductance of Fe/MgO/Fe sandwiches", Physical Review B. vol. 63, 054416, Jun. 21, 2000, pp. 1-12.
Sarpi, B., et al., "MgO monolayer epitaxy on Ni (100)", Applied Physics Letters 111, 211604 (2017), Nov. 22, 2017, pp. 1-12.

* cited by examiner

| Element | Oxide | Free energy of formation per mol of $O_2$ ($\times 10^{-6}$ J.kmol$^{-1}$) |
|---|---|---|
| Au | $Au_2O_3$ | 109 |
| Ag | $Ag_2O_3$ | -7 |
| Ru | $RuO_2$ | -253 |
| Cu | CuO | -254 |
| Co | CoO | -426 |
| Ni | NiO | -432 |
| Fe | FeO | -488 |
| Fe | $Fe_2O_3$ | -495 |
| Mo | $MoO_2$ | -502 |
| W | $WO_3$ | -509 |
| Sn | SnO | -514 |
| Zn | ZnO | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | BaO | -1056 |
| Hf | $HfO_2$ | -1084 |
| Mg | MgO | -1146 |
| Ca | CaO | -1208 |

MONOLAYER-BY-MONOLAYER GROWTH OF MGO LAYERS USING MG SUBLIMATION AND OXIDATION

PRIORITY DATA

The present application is a continuation application of U.S. application Ser. No. 16/161,161, filed Oct. 16, 2018, which is incorporated herein by reference in its entirety.

RELATED PATENT APPLICATION

This application is related to the following: U.S. Patent Application Pub. 2013/0333254, which is assigned to a common assignee and herein incorporated by reference in its entirety.

TECHNICAL FIELD

The present disclosure relates to a method of forming a MgO layer wherein all Mg atoms are oxidized and with no excess oxygen content (1:1 Mg:O ratio) when using a process of depositing Mg below 200° C. and then raising the substrate temperature to evaporate Mg and leave a Mg monolayer before oxidizing to a MgO monolayer and then repeating the process one or more times thereby improving MgO crystallinity, tuning a resistance x area (RA) value in the resulting MgO layer, and avoiding defects associated with underoxidation or overoxidation.

BACKGROUND

Magnetic tunnel junctions (MTJs) have a wide range of applications including tunneling magnetoresistance (TMR) hard drive read heads, magnetic sensors, magnetic random access memory (MRAM), and other spin-logic based devices. Specifically for MRAM applications, perpendicularly magnetized MTJs (p-MTJs) have attracted a considerable amount of interest due to their low writing currents using spin torque (STT-MRAM). STT-MRAM technology for writing of memory bits was described by J. Slonczewski in "Current driven excitation of magnetic multilayers", J. Magn. Magn. Mater. V 159, L1-L7 (1996), and is known for long data retention times, and the capability to be manufactured in high density memory arrays with relatively simple architecture.

P-MTJs have a general structure wherein first and second magnetic layers contact a bottom surface and top surface, respectively, of an insulating tunnel barrier. One of the magnetic layers called the pinned layer has a magnetization fixed in an out-of-plane direction (i.e. in the +z direction). The other magnetic layer, referred to as the free layer, has a magnetization that is free to be either in the +z direction (parallel or P state) or in the −z direction (antiparallel or AP state). The difference in resistance between the P state (Rp) and AP state (Rap) is characterized by the equation (Rap-Rp)/Rp that is hereinafter referred to as DRR. It is important for p-MTJ devices to have a large DRR, as this value is directly related to the read margin for the memory bit, or how easy it is to differentiate between the P state and AP state (0 or 1 bits).

For arrays of p-MTJ devices used in embedded memory applications, controlling the distribution of both Rp and DRR values is very important. Since embedded amplification circuits only operate within a certain range of Rp and DRR values, a p-MTJ device that falls out of an acceptable range of Rp or DRR cannot be effectively read and the memory bit will fail.

A key aspect of controlling p-MTJ device performance and keeping a tight Rp and DRR distribution is the quality of the tunnel barrier. Typical tunnel barriers are comprised of one or more of MgO, $Al_2O_3$, and other metal oxides. Tunnel barriers are quite susceptible to the formation of pinholes, grain boundaries, or other "weak" points that can locally reduce the tunnel barrier height or resistance thereby resulting in p-MTJs with low resistance (RA) and low DRR. If the defects are randomly distributed, the p-MTJ array may have a few devices that are affected by the tunnel barrier defects, and have a lower Rp and lower DRR than the main population of bits, causing both reading and writing failures. These bits outside the main population are referred to as "low tail" bits.

Two methods have historically been employed for MgO formation. One is deposition of MgO using either radio-frequency (RF) sputtering or electron beam (e-beam) evaporation. A second technique is deposition of Mg followed by oxidation either through exposure to a flow of gas (natural oxidation or NOX), or through exposure to oxygen based plasmas (radical oxidation or ROX), or ozone. These two methods may lead to significantly underoxidized MgO wherein a substantial number of Mg atoms are not oxidized, which lowers DRR, or to overoxidized MgO layers where loosely bound oxygen is free to diffuse during subsequent processing and cause adjacent magnetic layers to be oxidized, which also degrades device performance.

Thus, a new MgO formation method is required where the number of defects attributed to underoxidation or overoxidation is substantially reduced. In other words, a technique is desired to enable production of a MgO layer that has a 1:1 Mg:O ratio and containing no excess oxygen to prevent oxygen diffusion into adjacent layers during subsequent processing.

SUMMARY

One objective of the present disclosure is to provide a method of forming a MgO layer having a 1:1 Mg:O ratio wherein all Mg atoms are oxidized, and containing no loosely bound oxygen.

A second objective is to provide the MgO layer according to the first objective that is readily implemented as a tunnel barrier, Hk enhancing layer, or insulation layer during the fabrication of MRAM, hard disk drive (HDD), magnetic sensors, or spin-logic based devices.

According to one embodiment of the present disclosure, a MgO layer is comprised of a plurality of MgO monolayers that are successively formed on a substrate. The substrate may be a magnetic layer such as a pinned layer or free layer in a p-MTJ, or a metal oxide layer in a partially completed tunnel barrier layer or Hk enhancing layer in a p-MTJ, or a dielectric layer in a partially completed insulation layer within a MRAM, HDD, magnetic sensor, or spin-logic device. As a magnetic layer, the substrate may comprise one or both of Co and Fe, and further comprise one or more additional elements such as Ni, B, Cr, V, Mn, Zr, Mo, Nb, Hf, Ta, W, Ir, Pd, and Pt. As a metal oxide layer or dielectric layer, the substrate may be an oxide of Mg, Al, Ti, Si, or Ta that is either fully oxidized or underoxidized.

In one embodiment, the MgO layer is formed by a sequence of steps comprised of a first step of Mg deposition in a RF or direct current (DC) sputter deposition chamber, for example, at a temperature <200° C. to ensure that most of the Mg species that approach the substrate will stick thereto. Next, the substrate is annealed at a temperature between 200° C. and 900° C., and preferably from 200° C. to 400° C., and with a base pressure greater than $10^{-6}$ Torr in the RF sputter deposition chamber, or in a vacuum oven outside the sputter deposition mainframe. The annealing process causes a substantial portion of Mg on the substrate to evaporate (sublime), and leaves only a Mg monolayer that is bonded to oxygen atoms or other elements in the substrate. During a third step, the Mg monolayer remaining from the previous step is oxidized at a temperature from −223° C. up to 900° C., and preferably <400° C., thereby forming a MgO monolayer with the desired 1:1 Mg:O ratio because any oxygen that does not react with Mg diffuses out of the film and is removed from the oxidation chamber. The process flow involving Mg deposition, sublimation, and oxidation may be repeated one or more times to successively build a plurality of MgO monolayers that form a MgO layer with a thickness that provides a desired RA value, and wherein defects associated with underoxidation or overoxidation are essentially eliminated, and stoichiometry is more controlled compared with prior art MgO films for an improved crystal structure.

In some embodiments, the anneal and oxidation steps may be performed at the same temperature in a single chamber for faster throughput. In another embodiment, all three steps may be accomplished in the same chamber if the Mg deposition temperature is >200° C. and is equivalent to the annealing and oxidation temperatures.

In a second embodiment, the process flow of the first embodiment may be modified during the first step to include a doping element M selected from at least one of Ti, V, Cr, Mn, Fe, Ga, In, Al, Si, Ge, Sn, Zr, Mo, Nb, Hf, Ta, W, and N that is codeposited with Mg. The doping element may or may not evaporate during the annealing step, and may not be oxidized during the oxidation step. Accordingly, a different crystal structure may be realized within the resulting MgMO structure than the (001) rocksalt (bcc) structure for the MgO layer produced in the first two embodiments. Moreover, the M element may be employed to introduce substitutional defects in order to modify the band structure or conductivity in the MgMO film compared with a MgO layer.

BRIEF DESCRIPTION OF THE DRAWINGS

FIG. 19 is a table that lists the free energy of oxide formation for various metals.

DETAILED DESCRIPTION

Figure 1:
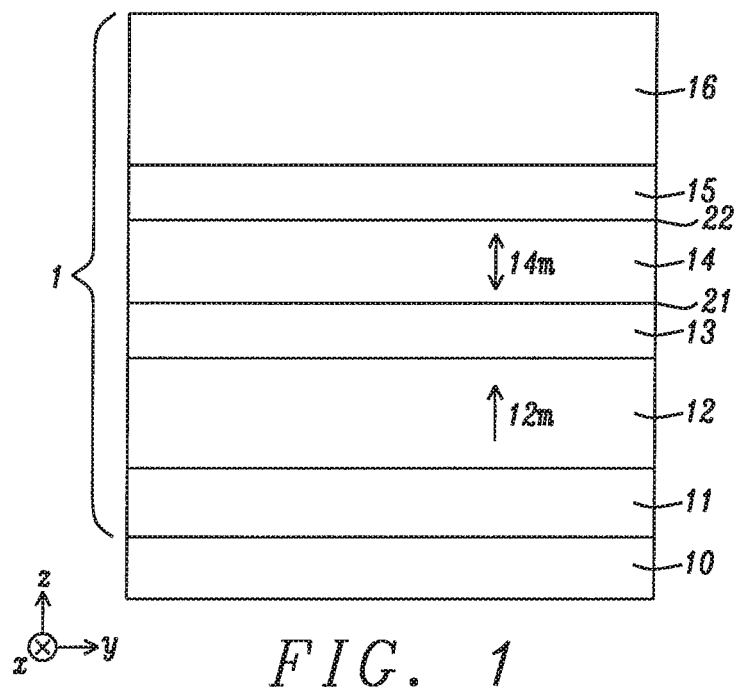
FIGS. 1-2 are cross-sectional views showing perpendicularly magnetized magnetic tunnel junctions (p-MTJs) wherein one or both of a tunnel barrier and Hk enhancing layer are a MgO layer made by a process flow of the present disclosure.

The present disclosure relates to a method of forming a MgO layer with a 1:1 Mg:O ratio and containing no excess oxygen. The improved control over stoichiometry and the resulting crystal structure after multiple anneal steps leads to a higher DRR (less defects and enhanced spin-filtering effect) when the MgO layer is a tunnel barrier in a p-MTJ. The MgO layer formed according to a method of the present disclosure may also serve as a Hk enhancing layer in a p-MTJ, or as an insulation layer in a magnetic or semiconductor device. The p-MTJ may be incorporated in a MRAM, STT-MRAM, sensor in a read head for a HDD, biosensor, or a spin-logic based device such as a spin torque oscillator (STO). Only one p-MTJ cell is depicted in some of the drawings, but typically millions of p-MTJs are arrayed in rows and columns on a substrate during fabrication of a magnetic device. A thickness of a layer in a p-MTJ is in a z-axis direction, and the plane of each layer is laid out in the x-axis and y-axis directions. The terms "pinned layer" and "reference layer" may be used interchangeably.

In related US 2013/0333254, we disclosed a method of fabricating a MgO tunnel barrier wherein a first Mg layer deposited on a substrate is underoxidized to prevent crack defects that enable oxygen to diffuse into an underlying magnetic layer. In particular, the first Mg layer is treated with a passive oxidation process at an oxygen pressure of ≤$10^{-5}$ torr, and then a second Mg layer is deposited on the partially oxidized first Mg layer and is oxidized with a process wherein oxygen pressure is typically $10^{-3}$ torr or greater.

Now we have discovered a method of MgO formation that provides the benefits of improved control over MgO stoichiometry and crystal structure, and that has flexibility in tuning RA and thickness in the resulting MgO layer. The MgO layer has a better film quality (less defects) than previously achieved and is expected to enable higher DRR when incorporated as one or both of a tunnel barrier and Hk enhancing layer in a p-MTJ.

According to one embodiment, a p-MTJ stack 1 has a MgO tunnel barrier 13 formed by a method of the present disclosure. The p-MTJ stack is fabricated on a substrate 10 that may be a bottom electrode in a MRAM or STT-MRAM, for example. The p-MTJ is comprised of a stack of layers wherein an optional seed layer 11, reference layer 12, tunnel barrier 13, free layer 14, Hk enhancing layer 15, and capping layer (hard mask) 16 are sequentially formed in a bottom spin valve configuration on the substrate. The seed layer is comprised of one or more of NiCr, Ta, Ru, Ti, TaN, Cu, Mg, Pt, Pd, or other materials typically employed to promote a smooth and uniform grain structure in overlying layers.

Reference layer 12 may have a synthetic anti-parallel (SyAP) configuration represented by AP2/Ru/AP1 where an antiferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier 13. AP1 and AP2 layers may be comprised of CoFe, CoFeB, Co, or a combination thereof. In other embodiments, one or both of the AP1 and AP2 layers may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer. Preferably, the reference layer has a magnetization 12m in the z-axis direction, and is in the (+) z-axis direction in the exemplary embodiment.

Free layer 14 may be Co, Fe, CoFe, or an alloy thereof and may further comprise one or both of B and Ni. In another embodiment, the free layer is a multilayer stack comprising two or more sub-layers having the aforementioned compositions that are ferromagnetically coupled. Moreover, there may be an interlayer layer such as Ta, Mg, Mo, W, Nb, V, Ir, Hf, Zr, Al, Si, or Ru inserted between two CoFe or CoFeB layers that are ferromagnetically coupled. In an alternative embodiment, the free layer (FL) has a SyAP configuration such as FL1/Ru/FL2 where FL1 and FL2 are two magnetic layers that are antiferromagnetically coupled, or is a laminated stack with inherent PMA described previously with respect to the reference layer composition. Perpendicular magnetic anisotropy (PMA) where magnetization 14m is aligned in either the (+) z-axis or (−z) axis direction is enhanced through interfacial perpendicular anisotropy caused by the MgO/FL interface 21.

Hk enhancing layer 15 is comprised of MgO, or another metal oxide, or is Mo, W, or another metal that induces interfacial perpendicular anisotropy in the free layer 14 proximate to the FL/Hk enhancing layer interface 22 thereby increasing PMA in the free layer to improve thermal stability. Note that when the Hk enhancing layer is a metal oxide, there is an additional contribution to the total RA in p-MTJ 1 where $RA_{TOTAL} = RA_{TUNNEL\ BARRIER} + RA_{HK\ ENHANCING\ LAYER}$.

Hard mask 16 is non-magnetic and generally comprised of one or more conductive metals or alloys including but not limited to Ta, Ru, TaN, Ti, TiN, and W. It should be understood that other hard mask materials including MnPt may be selected in order to provide high etch selectivity relative to underlying MTJ layers during an etch process that forms p-MTJ cells with sidewalls that stop on the bottom electrode. In other embodiments, the hard mask may be comprised of a conductive non-magnetic layer that is one or more of RuOx, ReOx, IrOx, MnOx, MoOx, TiOx, and FeOx.

Figure 2:
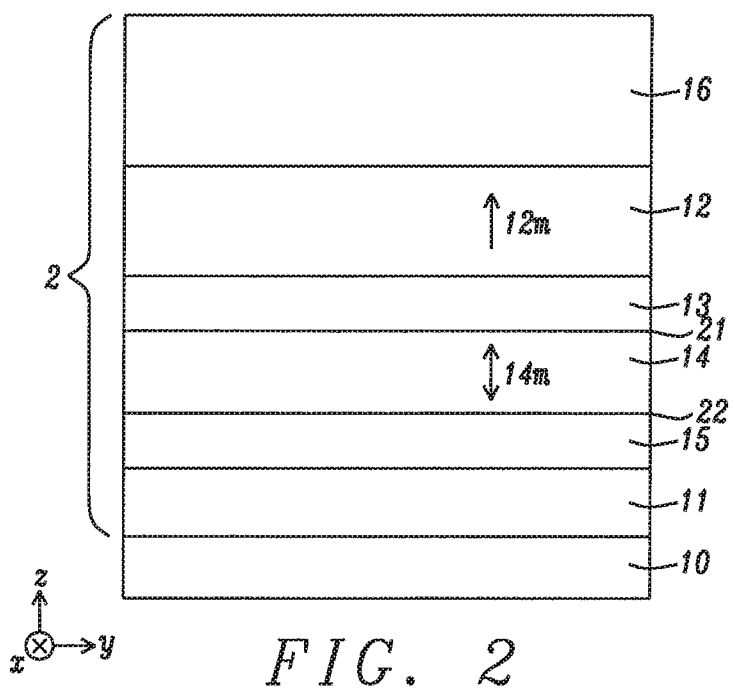

In an alternative embodiment shown in FIG. 2, tunnel barrier 13 may be formed in a p-MTJ stack 2 that has a top spin valve configuration. All layers are retained from FIG. 1 except the stacking order is changed such that seed layer 11, Hk enhancing layer 15, FL 14, tunnel barrier 13, reference layer 12, and hard mask 16 are sequentially formed on substrate 10.

Figure 3:
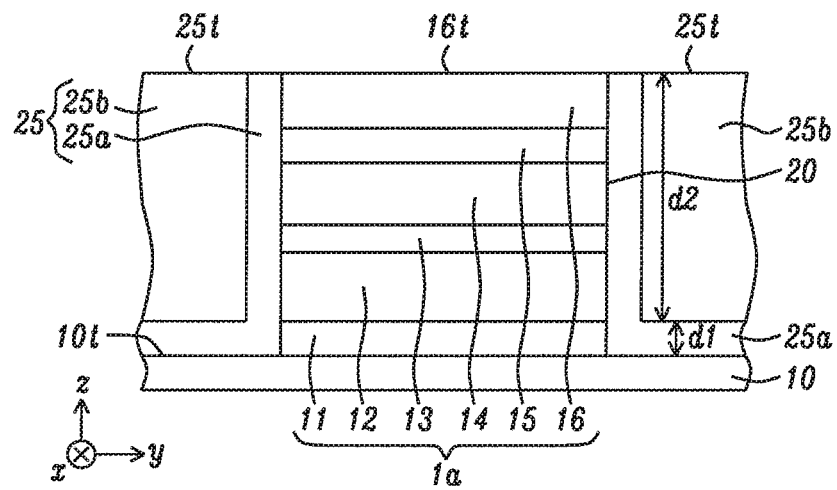
FIG. 3 is a cross-sectional view showing the p-MTJ in FIG. 1 that has been patterned and electrically isolated from adjacent p-MTJs by an encapsulation layer.

FIG. 3 depicts a p-MTJ cell 1a after the p-MTJ stack 1 in FIG. 1 is patterned using conventional photolithography and etching processes. As a result, sidewall 20 is formed on p-MTJ 1a and stops at substrate top surface 10t. An encapsulation layer 25 is deposited and may include an inner layer 25a adjoining sidewall 20 and the substrate top surface, and an outer layer 25b on the inner layer. A chemical mechanical polish (CMP) process is typically used to form a top surface 16t on p-MTJ 1a that is coplanar with encapsulation layer top surface 25t. The encapsulation layer electrically insulates p-MTJ 1a from adjacent p-MTJ cells (p-MTJs) shown in FIG. 4.

Figure 4:
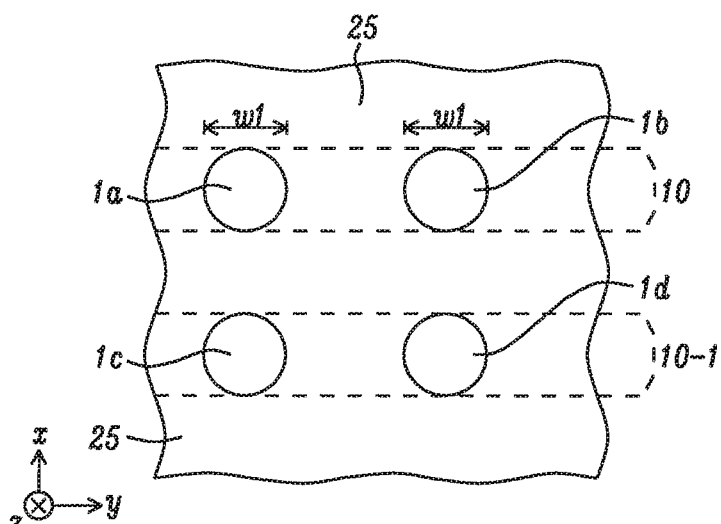
FIG. 4 is a top-down view of a MRAM array wherein a plurality of p-MTJs is formed in rows and columns.

Referring to FIG. 4, a plurality of p-MTJs is shown from a top-down view after the aforementioned CMP process. Only four p-MTJs are depicted to simplify the drawing and indicate that the p-MTJs are formed in an array of rows and columns, and are separated by encapsulation layer 25. P-MTJ 1a is in a first row with p-MTJ 1b and formed above bottom electrode 10 while p-MTJs 1c, 1d are in a second row above bottom electrode 10-1. Each p-MTJ has a width w1 and a substantially circular shape. However, elliptical shapes or polygonal shapes may be formed in other embodiments.

A key feature of the present disclosure is the process flow employed to form MgO tunnel barrier 13, and optionally a MgO film for Hk enhancing layer 15. A first embodiment is depicted in FIGS. 5-10 and relates to forming a MgO tunnel barrier on a substrate, which is reference layer 12 in the exemplary embodiment.

Figure 5:
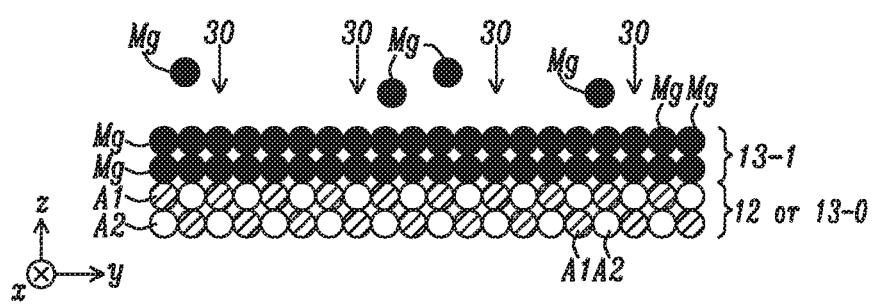
FIG. 5 depicts Mg deposition on a substrate during a first step of forming a MgO layer according to a first embodiment of the present disclosure.

Referring to FIG. 5, reference layer 12 serves as the substrate on which the MgO layer is formed in the exemplary embodiment, and is comprised of a crystal lattice of atoms shown as A1 and A2 where A1 is unequal to A2, and A1 and A2 alternate in horizontal and vertical directions. For example, A1 and A2 may be selected from Co and Fe. In other embodiments, A1 and A2 may represent Mg and O atoms, respectively, in a first MgO sub-layer 13-0 with a rocksalt (001) crystal structure formed on reference layer 12 by a conventional method. In this case, the first MgO sub-layer 13-0 may be formed by a passive oxidation or natural oxidation process described in related US 2013/0333254, or by sputter deposition of MgO. A first Mg layer 13-1 is then deposited (step 30) in a RF or DC sputter deposition chamber of sputter deposition tool that is available from multiple sources. Preferably, the Mg layer is deposited at a temperature below 200° C. so that a majority of the sputtered Mg species proximate to the substrate sticks to the reference layer 12, or to the first MgO sub-layer in the alternative embodiment.

In the following step shown in FIG. 6, a first annealing step 31 is performed at a temperature between 200° C. and 900° C., and preferably between 200° C. and 400° C. for a period of 5 to 300 seconds when the p-MTJ is formed in an embedded MRAM or STT-MRAM that is part of a complementary metal oxide semiconductor (CMOS) device. According to one embodiment, the first annealing step is performed in a different chamber than used for the Mg sputter deposition when the annealing temperature is substantially higher than the Mg deposition temperature. However, the present disclosure also anticipates that when the Mg deposition and annealing temperatures are essentially the same (≥200° C.), both steps 30 and 31 may be performed on the same wafer stage in the same process chamber. In all embodiments, the base pressure in the annealing chamber is generally between $1\times10^{-8}$ Torr and $1\times10^{-9}$ Torr. Preferably, the anneal is performed at a temperature where the Mg vapor pressure reaches $10^{-6}$ Torr or greater so that when Mg—Mg bonds break, a substantial amount of Mg will evaporate during a timeframe for acceptable process throughput.

Figure 12:
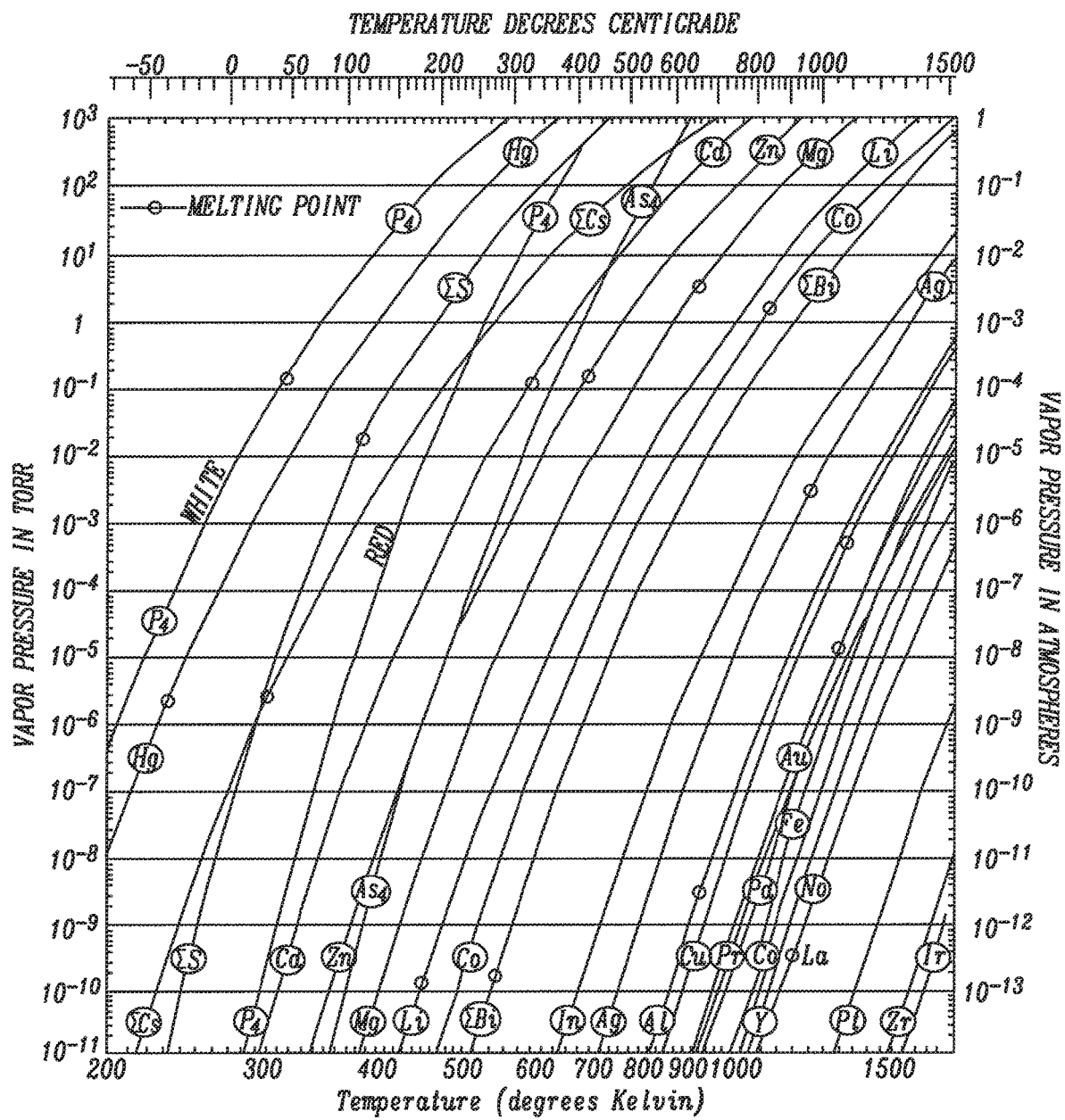
FIG. 12 is a graph that illustrates the vapor pressure of Mg and other elements at various temperatures.

This condition regarding Mg evaporation rate leads to the requirement of a minimum annealing temperature of 200° C. shown in FIG. 12 that is a graph taken from Richard E. Honig & Dean A. Kramer, RCA Review 30, pp. 285-305 (1969) and shows the vapor pressure for Mg at various temperatures. A Mg monolayer 13m1 remains on the substrate and is bonded to A2 atoms or O atoms, for example, in reference layer 12 or in metal oxide sub-layer 13-0, respectively. Generally, Mg atoms in layer 13-1 that form stronger bonds to the substrate (to A2 or O atoms) are retained more easily in monolayer 13m1 than Mg atoms having weaker bonds to the substrate (to A1 or Mg atoms), or with bonds only to other Mg atoms in layer 13-1. Any existing Mg—O bonds in the substrate will remain intact.

Figure 11:
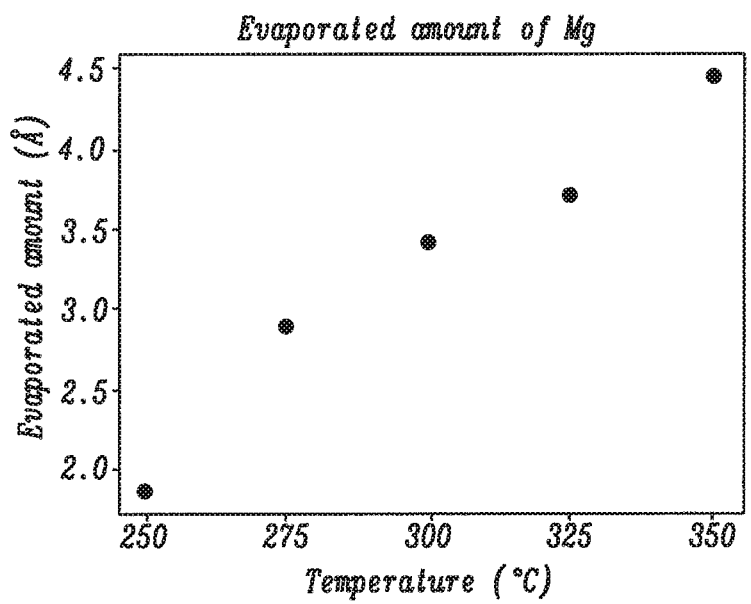
FIG. 11 is a plot showing the evaporated amount of Mg as a function of annealing temperature according to an embodiment of the present disclosure.

FIG. 11 is a plot of the amount of evaporated Mg in Angstroms for various anneal temperatures with a base pressure of $6 \times 10^{-9}$ Torr and a fixed process time of 100 seconds. Note that prior to the 100 seconds residence time at the final temperature between 250° C. and 350° C., there is a ramp time of 200 seconds to raise the wafer/substrate temperature from room temperature to the final temperature where data is generated for this experiment.

Figure 7:
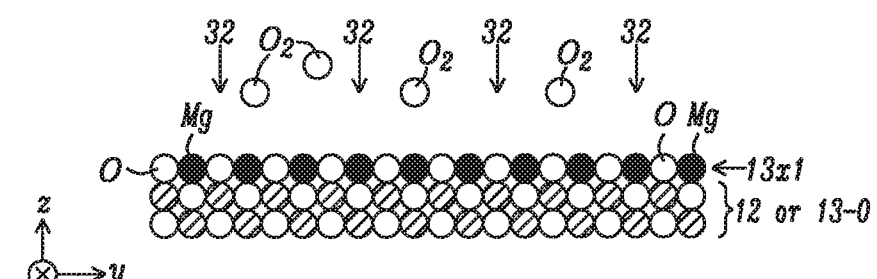
FIG. 7 depicts oxidation of the first Mg monolayer in the intermediate structure in FIG. 6 thereby forming a first MgO monolayer during a third step of MgO layer formation according to a first embodiment of the present disclosure.

Referring to FIG. 7, a third step 32 in the process flow of the first embodiment is an oxidation wherein Mg monolayer 13m1 is exposed to oxygen or oxygen species in a chamber at a temperature between −223° C. and 900° C., and preferably from 200° C. to 400° C. As the oxidation temperature decreases, there is a lower risk of oxygen diffusion into the underlying layers including the substrate. An oxygen species is defined as one or both of radicals and ions. Preferably, the oxidation is a natural oxidation involving a flow of oxygen. However, the oxidation may also be a radical oxidation, or exposure to ozone. Here, the wafer on which the partial p-MTJ structure is formed may be cooled to room temperature before oxidation, or the oxidation may take place at or proximate to the annealing temperature. The oxidation step may occur in the same chamber as the annealing step when steps 31 and 32 are carried out at essentially the same temperature, or are performed in different chambers when the Mg deposition and annealing temperatures are substantially different. As a result, each Mg atom in monolayer 13m1 is oxidized to form a first MgO monolayer 13x1 with a (001) rocksalt structure wherein the Mg:O ratio is 1:1. No excess oxygen remains in the first MgO monolayer since there are no vacant sites in the resulting crystal structure and unreacted oxygen returns to the atmosphere within the oxidation chamber.

Figure 6:
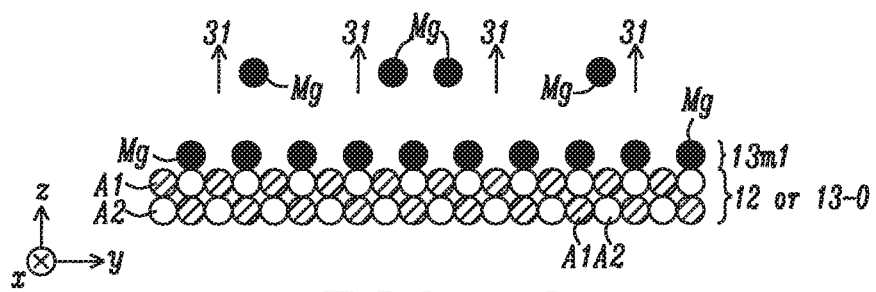
FIG. 6 depicts Mg sublimation from the intermediate structure in FIG. 5 thereby forming a first Mg monolayer during a second step of MgO layer formation according to a first embodiment of the present disclosure.
Figure 8:
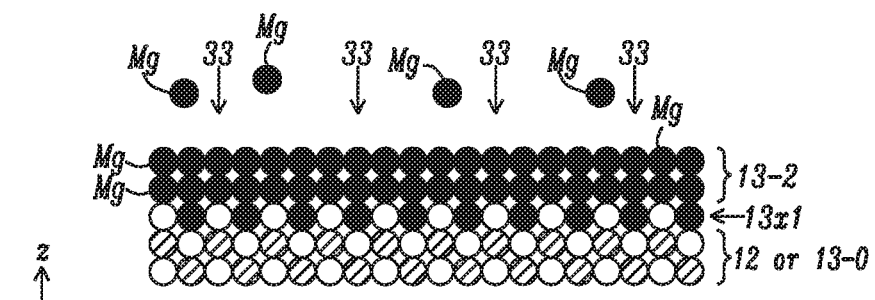
FIG. 8 depicts Mg deposition on the first MgO monolayer in FIG. 7 during a fourth step of forming a MgO layer according to a first embodiment of the present disclosure.
Figure 9:
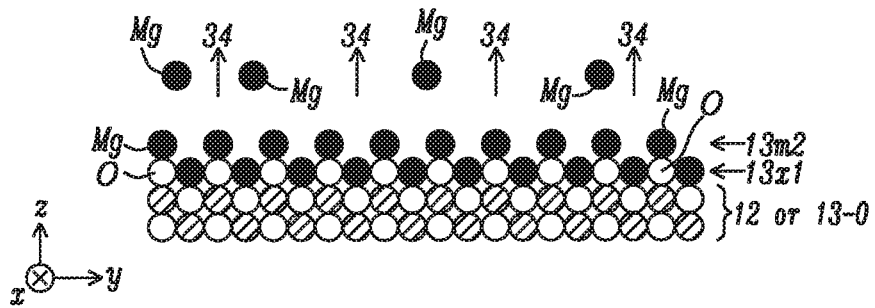
FIG. 9 depicts Mg sublimation from the intermediate structure in FIG. 8 to form a second Mg monolayer during a fifth step of MgO layer formation according to a first embodiment of the present disclosure.
Figure 10:
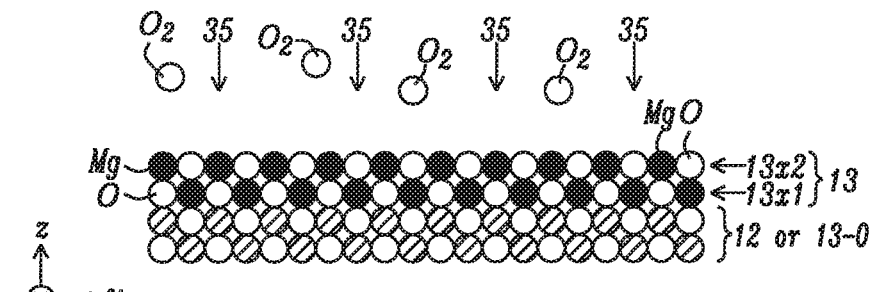
FIG. 10 depicts oxidation of the second Mg monolayer in FIG. 9 thereby forming a second MgO monolayer during a sixth step of MgO layer formation according to a first embodiment of the present disclosure.

Preferably, the Mg deposition, sublimation, and oxidation steps depicted in FIGS. 5-7, respectively, are repeated at least once to generate a second MgO monolayer on the first MgO monolayer 13x1 as illustrated in FIGS. 8-10. Accordingly, the final MgO tunnel barrier is comprised of a plurality of MgO monolayers with a strictly controlled 1:1 stoichiometry. Typically, four or five repetitions of the process are required to provide a tunnel barrier thickness from 10 Angstroms to 12 Angstroms. In other words, each MgO monolayer formed by the aforementioned process is about 2.1 Angstroms thick (one half of a unit cell in the 001 direction). Those skilled in the art will appreciate that a MgO tunnel barrier thickness from 6-12 Angstroms is usually necessary to reach a RA target less than 5 ohms-cm$^2$.

The present disclosure also encompasses an embodiment wherein both of the tunnel barrier 13 and Hk enhancing layer 15 are MgO, and are formed by the process flow described with regard to FIGS. 5-10. Note that the substrate for the Hk enhancing layer is free layer 14 in p-MTJ 1 with a bottom spin valve configuration (FIG. 1). In a top spin valve embodiment shown in FIG. 2, free layer 14 serves as a substrate on which the MgO tunnel barrier 13 is formed, and the Hk enhancing layer is formed on seed layer 11. In FIGS. 1-2, interface 21 between the tunnel barrier and free layer induces interfacial perpendicular anisotropy in the free layer, and interface 22 between the free layer and Hk enhancing layer induces interfacial perpendicular anisotropy in the free layer.

Figure 13:
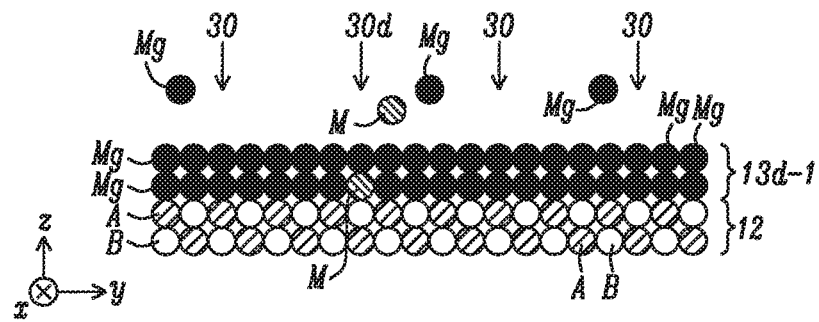
FIGS. 13-18 are cross-sectional views showing a sequence of steps that form a doped MgO layer according to a second embodiment of the present disclosure.

According to a second embodiment of the present disclosure illustrated in FIGS. 13-18, the process flow of the first embodiment is modified with the inclusion of at least one doping element M during at least one Mg deposition so that Mg and M are codeposited on the substrate. Preferably, M is one or more of Ti, V, Cr, Mn, Fe, Ga, In, Al, Si, Ge, Sn, Zr, Mo, Nb, Hf, Ta, W, and N. In FIG. 13, deposition 30 of Mg atoms is accompanied by deposition 30d of dopant atoms M at a temperature <200° C. to yield a MgM layer 13d-1 on substrate 12, for example, where M has a content from a plurality of ppm to a maximum of about 75 atomic % in the MgM alloy. The one or more M elements are advantageously used to introduce substitutional defects in order to modify the band structure or conductivity in the resulting MgMO film compared with an MgO layer of the first embodiment.

Figure 14:
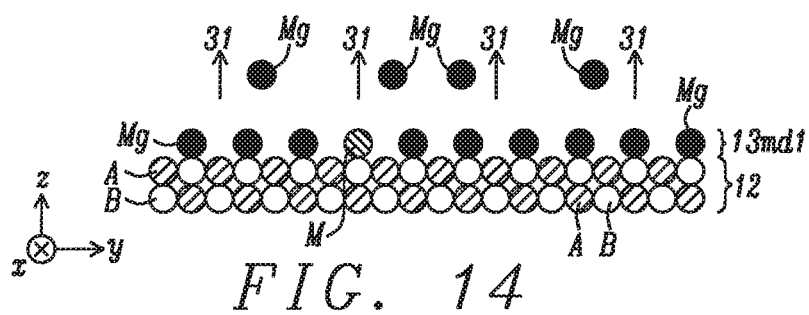

Referring to FIG. 14, a first annealing step 31 is performed at a temperature between 200° C. and 900° C., and preferably from 200° C. to 400° C., to sublime a substantial portion of Mg atoms in layer 13d-1. The anneal is performed at a temperature where the Mg vapor pressure is $\geq 10^{-6}$ Torr so that when Mg—Mg bonds break, a substantial amount of Mg will evaporate thereby leaving a monolayer 13md1 of Mg and M atoms on the substrate. The Mg and M atoms remaining on the substrate may be preferentially bonded to A2 atoms or O atoms, for example, in reference layer 12 or in metal oxide sub-layer 13-0, respectively. In some embodiments, M atoms do not sublime depending on the annealing temperature. Generally, M atoms of a metallic element have a higher melting point and lower vapor pressure than Mg at a given temperature, which means the M content in monolayer 13md1, is typically greater than in the initially deposited MgM layer 13d-1.

Figure 15:
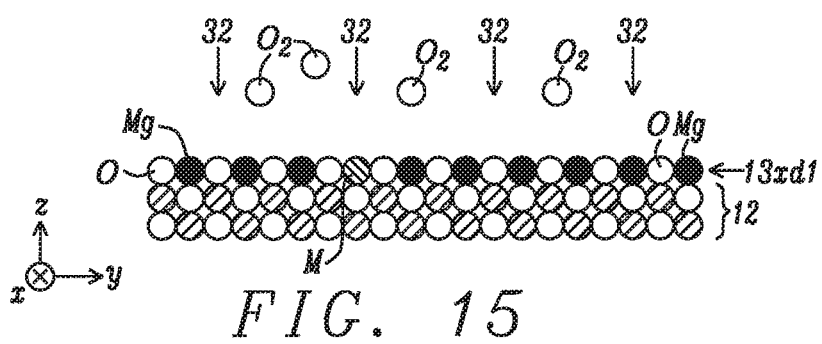
Figure 16:
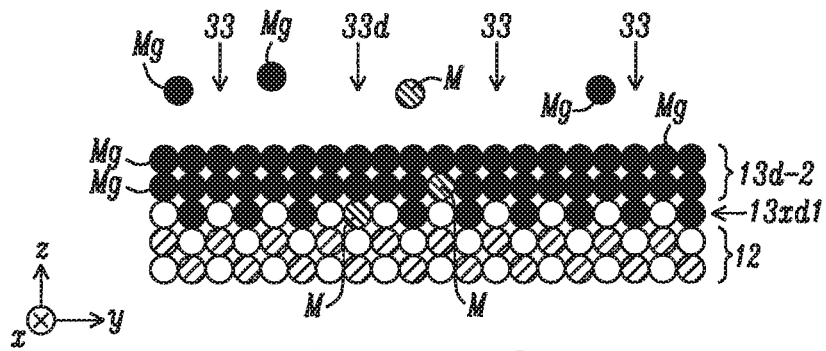

Referring to FIG. 15, the next step in the process flow of the second embodiment is an oxidation step 32 wherein Mg atoms within monolayer 13md1 are exposed to oxygen or oxygen species in a chamber at a temperature from about −223° C. up to 900° C., and preferably below 400° C. As a result, each Mg atom in monolayer 13md1 reacts with oxygen to form a first MgMO monolayer 13xd1 wherein the Mg:O ratio is 1:1. No excess oxygen remains in the first MgMO monolayer since unreacted oxygen returns to the atmosphere within the oxidation chamber. M atoms may not react with oxygen depending on the oxidation conditions and the free energy of oxide formation shown in the table in FIG. 19. Elements such as Mg with larger negative numbers toward the bottom of the table have a higher rate of reaction with oxygen than M elements at or proximate to the top of the table.

As in the first embodiment, each of the MgM deposition, anneal, and oxidation steps are usually performed in different process chambers when the MgM deposition, anneal, and oxidation involve different temperatures for each process. On the other hand, if the anneal and oxidation steps employ the same temperature, then both steps 31 and 32 may occur in the same process chamber. Moreover, if the MgM deposition is increased to 200° C., and is at the same temperature as the anneal and oxidation steps, then all three processes may be performed in the same chamber.

The second embodiment of the present disclosure anticipates that the process flow of metal deposition, annealing, and oxidation may be repeated one or more times. Thus, in FIG. 16, a second Mg deposition 33 occurs simultaneously with deposition 33d of one or more dopants M described previously. The second codeposition 33/33d yields a second doped layer 13d-2 on first MgMO monolayer 13xd1. Dopant M concentration in layer 13d-2 may be unequal to the M concentration in the first doped layer 13d-1.

Figure 17:
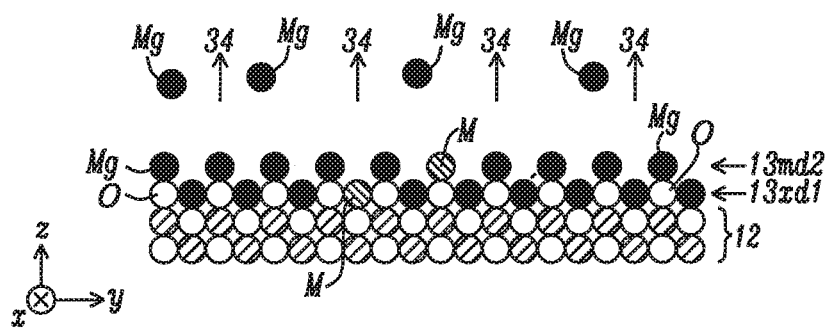
Figure 18:
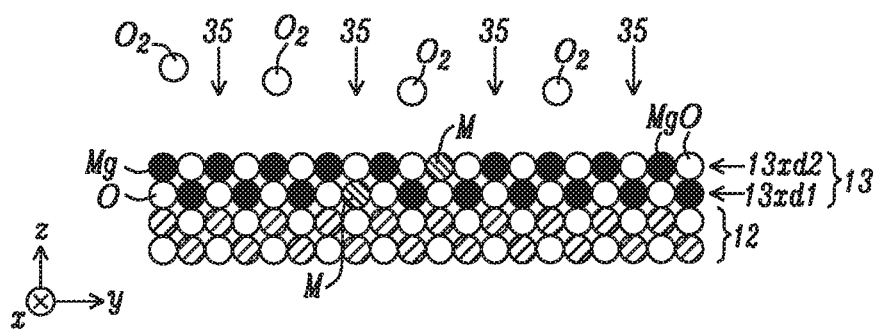

In FIG. 17, a second anneal step 34 is performed at a temperature between 200° C. and 900° C., and preferably from 200° C. to 400° C., and causes a substantial portion of Mg atoms in layer 13d-2 to sublime. Meanwhile, dopant M atoms may or may not sublime. Accordingly, a second MgM monolayer 13md2 is formed on the first MgMO monolayer 13xd1, and may have a greater M content than the M content in layer 13d-2. The remaining Mg and M atoms may bond preferentially to oxygen atoms rather than to Mg atoms in the first MgMO monolayer.

A second oxidation step 35 at a temperature from −223° C. to 900° C., and preferably 200° C. to 400° C., is performed to oxidize Mg atoms in second MgM monolayer thereby forming second MgMO monolayer 13xd2 wherein the Mg:O ratio is 1:1. First and second MgMO monolayers 13xd1, 13xd2, respectively, form tunnel barrier 13 if a third MgMO monolayer is unnecessary to provide the desired RA and tunnel barrier thickness. However, additional repetitions of the MgM deposition, anneal step, and oxidation step may be required to provide a desired RA value and thickness of the resulting MgMO layer.

All of the embodiments described herein may be incorporated in a manufacturing scheme with standard tools and processes. Film quality in MgO tunnel barriers, Hk enhancing layers, or insulation layers made by this method is significantly enhanced because of fewer defects associated with underoxidized or overoxidized MgO layers where the Mg:O ratio is <1:1 or >1:1, respectively. The use of elevated temperatures up to 900° C. in a monolayer-by-monolayer growth mode allows for increased surface diffusion of Mg and oxygen during MgO formation and therefore a higher degree of crystallinity for a MgO barrier than in the prior art. Accordingly, the tunnel barrier's spin filtering nature and important p-MTJ performance metrics including DRR, writing current, and interface induced PMA are improved.

While the present disclosure has been particularly shown and described with reference to, the preferred embodiment thereof, it will be understood by those skilled in the art that various changes in form and details may be made without departing from the spirit and scope of this disclosure.

What is claimed is:

1. A method comprising:
    forming a first Mg layer on a substrate;
    performing a first anneal at a first temperature such that a portion of the first Mg layer sublimes thereby leaving a first Mg monolayer on the substrate; and
    performing a first oxidation on the first Mg monolayer at a second temperature thereby forming a first MgO monolayer with a 1:1 Mg:O ratio.

2. The method of claim 1, wherein the first and second temperatures are essentially equivalent.

3. The method of claim 1, wherein the first temperature is different than the second temperature.

4. The method of claim 1, wherein the first temperature ranges from about 200° C. to about 900° C., and wherein the second temperature from about −223° C. to about 900° C.

5. The method of claim 1, further comprising forming:
    forming a reference layer on the substrate; and
    forming a free layer on the substrate, and
    wherein forming the first Mg layer on the substrate includes forming the first Mg layer directly on the reference layer such that the first Mg layer interfaces with the reference layer.

6. The method of claim 1, further comprising forming:
    forming a reference layer on the substrate; and
    forming a free layer on the substrate, and
    wherein forming the first Mg layer on the substrate includes forming the first Mg layer directly on the free layer such that the first Mg layer interfaces with the free layer.

7. The method of claim 1, further comprising:
    forming a second Mg layer directly on the first MgO layer such that the second Mg layer interfaces with the first MgO layer;
    performing a second anneal at a third temperature such that a portion of the second Mg layer sublimes thereby leaving a second Mg monolayer on the first MgO layer; and
    performing a second oxidation on the second Mg monolayer at a fourth temperature thereby forming a second MgO monolayer with a 1:1 Mg:O ratio.

8. A method comprising:
    providing Mg and M to form a first MgM layer on a substrate, wherein M is a first doping element;
    performing a first anneal at a first temperature such that a portion of Mg atoms in the first MgM layer sublimes thereby leaving a first MgM monolayer on the substrate; and
    performing a first oxidation on the first MgM monolayer at a second temperature thereby forming a first MgMO monolayer.

9. The method of claim 8, wherein the doping element M is selected from the group consisting of Ti, V, Cr, Mn, Fe, Ga, In, Al, Si, Ge, Sn, Zr, Mo, Nb, Hf, Ta and N.

10. The method of claim 8, wherein the first MgMO monolayer includes a 1:1 Mg:O ratio.

11. The method of claim 8, wherein providing Mg and M to form the first MgM layer on the substrate includes co-depositing Mg and M with a sputter deposition process.

12. The method of claim 8, wherein the MgMO layer is a layer selected from the group consisting of a tunnel barrier layer, an Hk enhancing layer and an insulation layer, and
    wherein the layer is part of a magnetic tunnel junction device.

13. The method of claim 8, wherein providing Mg and M to form the first MgM layer on the substrate includes providing Mg and M at a third temperature, and
    wherein the third temperature is different than the first and second temperature.

14. The method of claim 8, wherein providing Mg and M to form the first MgM layer on the substrate includes providing Mg and M at a third temperature, and
    wherein the first, second and third temperatures are essentially equivalent.

15. The method of claim 8, wherein the first temperature ranges from about 200° C. to about 900° C., and
    wherein the second temperature from about −223° C. to about 900° C.

16. The method of claim 8, further comprising:
    providing Mg and a second M to form a second MgM layer on the first MgMO monolayer, wherein the second M is a second doping element, wherein the first MgM layer has a first concentration of the first doping element and the second MgM layer has a second concentration of the second doping element, the second concentration being different than the first concentration;

performing a second anneal at a third temperature such that a portion of Mg atoms in the second MgM layer sublimes thereby leaving a second MgM monolayer on the substrate; and performing a second oxidation on the second MgM monolayer at a fourth temperature thereby forming a second MgMO monolayer.

17. A method comprising:

forming a first layer on a substrate, the first layer including Mg;

performing an evaporation process on the first layer to remove a portion of Mg atoms to thereby form a monolayer that includes Mg; and oxidizing the monolayer to form an oxidized monolayer, the oxidized monolayer including a 1:1 Mg:O ratio.

18. The method of claim 17, wherein oxidizing the first Mg monolayer includes performing an oxidation process selected from the group consisting of a natural oxidation, a radical oxidation, and an ozone exposure.

19. The method of claim 17, wherein the first layer includes further includes a dopant element selected from the group consisting of Ti, V, Cr, Mn, Fe, Ga, In, Al, Si, Ge, Sn, Zr, Mo, Nb, Hf, Ta and N, and wherein the monolayer and the oxidized monolayer include the doping element.

20. The method of claim 17, wherein forming the first layer on the substrate includes depositing Mg on the substrate at a temperature less than 200° C.

* * * * *